United States Patent [19]

Pepper

[11] Patent Number: 5,926,494
[45] Date of Patent: Jul. 20, 1999

[54] LASER SYSTEMS WITH IMPROVED PERFORMANCE AND REDUCED PARASITICS AND METHOD

[75] Inventor: David M. Pepper, Malibu, Calif.

[73] Assignee: Hughes Electronics Corporation, El Segundo, Calif.

[21] Appl. No.: 08/827,791

[22] Filed: Apr. 11, 1997

[51] Int. Cl.[6] .............................. H01S 3/091; H01S 3/092
[52] U.S. Cl. ........................................................ 372/70
[58] Field of Search ................................. 372/70, 40, 41, 372/19, 96

[56] References Cited

U.S. PATENT DOCUMENTS

| | | | |
|---|---|---|---|
| 3,786,368 | 1/1974 | Bjorkholm et al. | 372/70 |
| 3,970,960 | 7/1976 | Mollenauer | 372/70 |
| 3,992,681 | 11/1976 | Haun et al. | 372/70 |
| 4,757,268 | 7/1988 | Abrams et al. . | |
| 5,754,572 | 5/1998 | Pinto et al. | 372/70 |

OTHER PUBLICATIONS

Giesen, et al. "Scalable Concept for Diode–Pumped High–Power Solid–State Lasers" Applied Physics B 58, pp. 365–372, Springer–Verlag (1994). No Month.

Le, Di Cecca and Mooradian, "Scalable High–Power Optically Pumped GaAs Laser", Applied Physics Lett, vol. 58, No. 18, 1967–1969, American Insistitute of Physics (1991). No Month.

Primary Examiner—Rodney Bovernick
Assistant Examiner—Robert E. Wise
Attorney, Agent, or Firm—V. D. Duraiswamy; M. W. Sales

[57] ABSTRACT

A system and a method of pumping a gain medium element in one or more stages of a laser amplifier or oscillator with a spatially inhomogeneous optical pump beam, to minimize the potential for parasitic oscillation modes and amplified spontaneous emissions. The method is preferably accomplished by generating a spatially modulated optical pump beam, and pumping the gain medium element with the spatially modulated optical pump beam, to optically fragment the gain medium element into discontinuous amplifying gain regions, thereby creating a very lossy configuration for undesirable lateral modes, while maintaining a high-gain path for the desired longitudinal mode of operation. If there is more then one amplifier stage, the substantially identical optical pump beams are used in each stage and the gain regions of one gain medium element are spatially mapped onto the gain regions of the subsequent gain medium element. The spatially modulated optical pump beam may be generated by passing an input pump beam through an optical phase mask element.

27 Claims, 6 Drawing Sheets

LASER SYSTEMS WITH IMPROVED PERFORMANCE AND REDUCED PARASITICS AND METHOD

BACKGROUND OF THE INVENTION

1. Field of the Invention

The present invention relates generally to the field of laser oscillators and master-oscillator power amplifiers (MOPA's), and more particularly to laser oscillators and MOPA's using spatially inhomogeneous optical pumping beam patterns to minimize the potential for parasitic oscillation modes and amplified spontaneous emission (ASE) loss, leading to a new class of low-power, compact, high-efficiency oscillators and MOPA's, as well as to a new class of high-power, cw or Q-switched scalable laser systems.

2. Brief Description of the Prior Art

Typically, optical pump beams to be used in laser oscillators and master-oscillator power amplifiers are designed to be spatially uniform. This results in undesirable energy depletion in transverse (i.e., lateral) directions across the laser gain media both in oscillators as well as in MOPA's. This undesirable result is especially noticeable in systems with high-gain laser media, with large aspect ratios, which incorporate several disk amplification stages, and can make them inadequate for a given application. For example, optical sources for high-power welders, and other industrial and DoD laser applications, need to give output with high gain and/or great amount of power. However, the existing state-of-the-art optical systems used in these applications have high potential for parasitic modes and ASE loss, thus requiring design tradeoffs and use of less efficient optical sources.

Some conventional laser systems use dimension limiting schemes to avoid parasitics and ASE loss. The first method involves merely limiting the physical size of the gain medium, or the transverse spatial extent of the uniform pump beam. The article "Scalable Concept For Diode-Pumped High-Power Solid-State Lasers", by A. Giesen et al., published in Applied Physics B 58, 365–372, Springer-Verlag (1994), describes a three-level laser gain media element which employ thin disk stages attached to coolers. In this application, the size of the surface area of the disk has to be limited due to parasitics, while the thickness is limited by thermal considerations. These limitations in size dictate a reduction in size of the usable surface area of the gain medium, which results in a lower number of the usable pump photons. See also "Scalable High-Power Optically Pumped GaAs Laser" by Le, Di Cecca and Mooradian, published in Applied Physics Lett., Vol. 58, No. 18, 1967–1969, American Institute of Physics (1991).

Another method to circumvent undesirable transverse losses involves physically sectioning or otherwise modifying large-size gain medium into a number of smaller discrete gain cells, as described in U.S. Pat. No. 4,757,268 issued in 1988 to Abrams et al. As an example of the latter case, a large transverse area gain medium, such as Nd:YAG, is longitudinally sectioned or sliced into a number of small segments. In addition, loss elements (e.g., absorbing slabs) may be placed between the gain medium elements to avoid transverse parasitics of the package. Further, this technique also requires coherent combining of the discrete amplifying stages to realize optimal far-field performance, which is usually accomplished via adaptive optics or via nonlinear optical phase conjugation. The ensemble can then be coherently combined using a double-pass phase-conjugate MOPA configuration.

In yet another known conventional method of reducing ASE and parasitic oscillation modes, a large-area wafer with a MQW epilayer, which serves as the gain medium, is processed during growth to generate discrete gain regions which can yield gain under optical pumping, while other regions cannot, even in the presence of the pump beams. However, this procedure requires additional processing steps during epilayer growth, which adds cost and complexity to the system.

SUMMARY OF THE INVENTION

The preceding and other shortcomings of prior art systems are addressed and overcome by various aspects of the present invention, which consists of a system utilizing a spatially inhomogeneous optical pumping beam to minimize the potential for parasitic oscillation modes and amplified spontaneous emission (ASE) in laser media.

The present invention is conceptually similar to the above-described amplifier schemes using sectioned or sliced gain media, but is made possible without physically segmenting or modifying the gain media. Instead, an optical pump source is used to effectively segment the gain medium into gain and loss regions, using passive optical elements. In another embodiment, discrete segments can be electrically addressed to realize similar benefits. Moreover, the required physical loss elements are automatically realized since, in known three-level gain media as well as in various semiconductor-based four-level media, the unpumped regions are lossy, due to background optical absorption. Therefore, no additional physical loss elements are needed.

Furthermore, due to the use of passive optical elements to effectively segment the pump beam, the system cost and complexity are greatly reduced. Finally, since the gain media is monolithically formed on a single substrate, the output can essentially preserve the wavefront of an input beam, as opposed to the conventional methods, where a discrete number of physical elements needs to be dimensioned to within a fraction of an optical wavelength, to preserve the optical quality of a signal beam. Therefore, subject to dynamic thermal distortions, the systems of the present invention may not even require adaptive optical compensation, other than static phase-corrector plates or imaging elements.

Accordingly, it is the purpose of this invention to provide an inexpensive system with minimal parasitic and ASE loss, which can be used in low-power, compact, high-efficiency oscillators and MOPA's, as well as in high-power, cw or Q-switched scalable laser systems.

Another purpose of the invention is to provide a high performance, high-efficiency optical sources for high-power welders, and other industrial and DoD laser applications, without limiting the physical size, i.e., the thickness and the size of the surface area, of the gain medium.

Yet the more specific purpose of the present invention is to circumvent undesirable conventional methods for avoidance of parasitics, involving physically sectioning or otherwise modifying large-size gain medium into a number of smaller discrete gain cells, and to avoid use of loss elements (e.g., absorbing slabs), placed between the gain cells.

Still another object of the present invention is to coherently combine a double-pass phase-conjugate MOPA configuration via passive optical elements, to avoid the need for coherent combining of the discrete amplifying stages via adaptive optics or via nonlinear optical phase conjugation.

Yet another object of the present invention is to avoid special processing during the epilayer growth of the gain medium, and thus decrease cost and complexity to the system.

One embodiment of the present invention is a method of pumping a gain medium element in each stage of a laser amplifier or oscillator with a spatially inhomogeneous optical pump beam, to minimize the potential for parasitic oscillation modes and amplified spontaneous emission. The method is accomplished by generating a spatially modulated optical pump beam for each amplifier stage, and simultaneously pumping the gain medium element in each stage with the spatially modulated optical pump beam, to optically fragment the gain medium element into discontinuous amplifying gain regions, without physically modifying the gain material itself, thereby creating a very lossy configuration for undesirable lateral mode, while maintaining a high-gain path for the desired longitudinal mode of operation.

If there is more then one amplifier stage, the gain regions of one gain medium element are spatially mapped onto the gain regions of the subsequent gain medium element using imaging optical techniques. The spatially modulated optical pump beam may be generated by passing an input pump beam through an optical phase mask, a lenslet array, a multi-mode fiber, or a grating (either binary or analog), which may be the same for each stage. Alternatively, an array of pump-laser elements, which may be mutually incoherent, can be used to create a spatially inhomogenous pump source.

Another four preferred embodiments of the present invention all have a laser system, which uses a spatially inhomogeneous optical pump beam to minimize the potential for parasitic oscillation modes and amplified spontaneous emission. It includes an input signal beam, an amplified output signal beam, at least one spatially modulated optical pump beam, at least one laser pump for generating the at least one spatially modulated optical pump beam, and at least one gain medium element. Each gain medium element is adapted to receive the input signal beam and to be continuously or temporally pumped by the laser pump with one spatially modulated optical pump beam, in order to amplify them to produce the amplified output signal beam. The gain medium element is optically fragmented into discontinuous amplifying gain regions by the spatially modulated optical pump beam, thereby having a very lossy configuration for undesirable lateral mode, while maintaining a high-gain path for the desired longitudinal mode of operation.

The oscillation mode can either be designed to be normal to the gain medium element plane (on-axis) or can be at an arbitrary angle from normal incidence (off-axis). All embodiments of the laser system of the present invention further include an image relay system for spatial mapping of the gain regions of one gain medium element onto the gain regions of the subsequent gain medium element, if there is a plurality of the gain medium elements. If necessary, a phase corrector plate can be placed within the cavity or extend to the cavity, to result in a uniform output beam. The laser pump includes an optical pumping source, an input pump beam generated by the optical pumping source, and an optical phase mask element for generating the spatially modulated optical pump beam.

Still another embodiment of the present invention further includes a polarizing beam splitter, at least one dichroic beam splitter, and at least one quarter-wave plate, disposed between the dichroic beam splitter and the gain medium element.

Yet another embodiment of the present invention is a laser oscillator, which also has at least one cavity mirror, at least one phase-corrector plate, and an optional intracavity optical Q-switch.

Another embodiment of the present invention is a master-oscillator power amplifier, further having a master oscillator to provide a seed beam, a phase-conjugate mirror, disposed distally from the master oscillator, for reflecting phase conjugate laser radiation in response to amplified laser radiation incident thereon, and a quarter-wave plate, disposed between the phase-conjugate mirror and one of the at least one gain medium element, to modify the polarization state of the amplified laser radiation and to generate the amplified output signal beam to be directed out of the laser system.

Thus, the present invention effectively segments the gain medium into discrete gain regions using only optical elements and without physically segmenting or modifying the gain media. By pumping the gain media in localized spatial regions, as opposed to global pumping, the amplifier stage is, in essence, optically fragmented into discontinuous amplifying gain regions, along with unpumped, loss regions in-between the gain regions.

By moving (e.g. rotating) the disk or the pump laser pattern, e.g. the optical phase mask element, at a rate slower than the stimulated emission rate of the inverted gain medium element, yet at a rate comparable to the set time constant, more uniform thermal loading of the gain medium element will result, therefore minimizing thermal distortions in the gain medium element, without adversely affecting the laser efficiency.

By using the techniques of the present invention, the area of the disk can be increased considerably, enabling employment of larger volume gain media, and leading to greater stored energy in the amplifier stage. In another case, higher gains can be achieved in more compact configurations, since the parasitic-limiting pump threshold can be greatly increased.

The foregoing and additional features and advantages of this invention will become further apparent from the detailed description and accompanying drawing figures that follow. In the figures and written description, numerals indicate the various features of the invention, like numerals referring to like features., throughout for the drawing figures and the written description.

DETAILED DESCRIPTION OF THE INVENTION

This invention relates to a method and a laser system using the spatially inhomogeneous optical pumping beams to minimize the potential for parasitic oscillation modes and amplified spontaneous emission (ASE) in laser amplifiers and oscillators.

Figure 1:
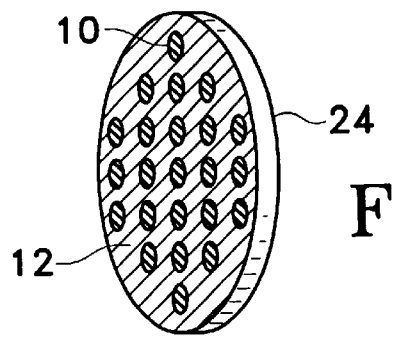
FIG. 1 is a cross-sectional view of a gain medium element, indicating regions of high gain and regions of loss, which correlate with the spatial pattern of the optical pumping beam profile incident to the gain medium element.

FIG. 1 is a cross-sectional view of a gain medium element 24 indicating gain regions 10 and loss regions 12, which correlate with the spatial pattern of the optical pumping beam profile incident to the gain medium element 24. The loss regions 12 provide isolation that effectively prevents occurrence of amplified spontaneous emission loss, after multiple passes through the gain medium element 24 of an amplifier.

One embodiment of the present invention is a method of pumping a gain medium element in a laser amplifier or oscillator with a spatially inhomogeneous optical pump beam, to minimize the potential for parasitic oscillation modes and amplified spontaneous emission. The method is accomplished by pumping the gain medium element in each stage with the spatially modulated optical pump beam, to optically fragment the gain medium element into discontinuous amplifying gain regions, thereby creating a very lossy configuration for undesirable lateral mode, while maintaining a high-gain path for the desired longitudinal mode of operation.

The present invention has several embodiments, with a variety of cavity configurations, used with a single gain medium element in one amplifier stage, a pair of gain medium elements and stages, or a number of cascaded gain medium elements in several amplifier stages. If there is more then one amplifier stage, all the gain media elements are pumped with substantially the same optically modulated optical pump beam and the gain regions of one gain medium element are spatially mapped onto the gain regions of the subsequent gain medium element. The spatially modulated optical pump beam may be generated by passing an input pump beam through an optical phase mask, multi-mode fiber, an array of fibers, or an array of incoherent pump lasers, such as laser diode arrays.

The basic system of the present invention consists of an ensemble having a gain medium element, an optical pumping source, and an optical phase mask to spatially modulate the input pump beam prior to its impinging onto the gain medium element. An optical imaging system maps the gain regions of the first gain medium element onto the gain regions of the subsequent gain medium elements, if more than one amplification stage is desired. Multiple gain medium elements, in multiple amplifier stages, may be used in order to obtain increased energy and/or power output.

Figure 2:
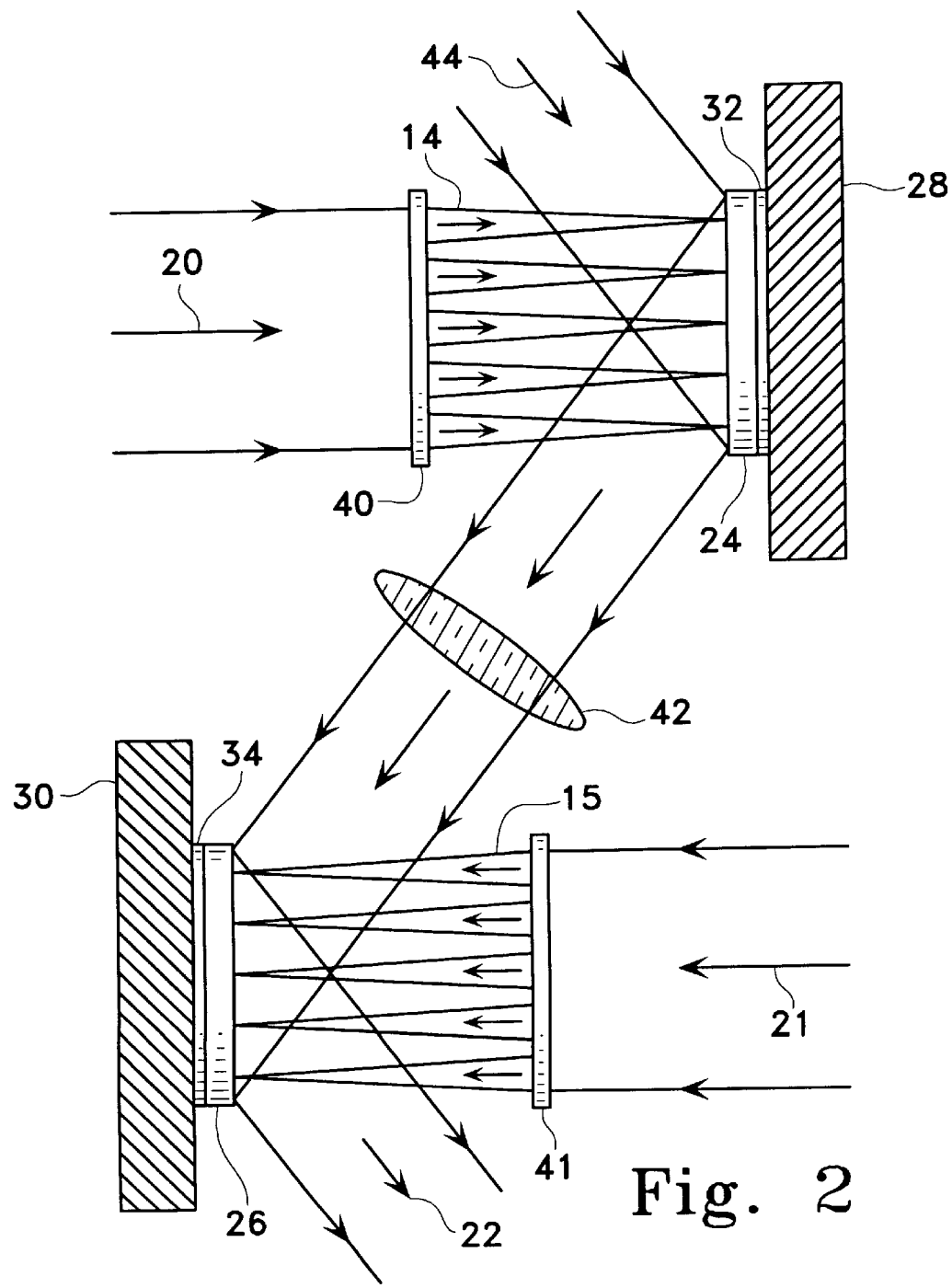
FIG. 2 is an illustration of the basic architecture of a pumping scheme of one embodiment of the present invention, using angular decoupling of the input and the amplified output signal beams, and spatially inhomogeneous optical pumping of the gain medium.

FIGS. 2–5 show examples of several embodiments of the present invention. In accordance with one preferred embodiment of the present invention, FIG. 2 presents an illustration of the basic architecture of a pumping scheme, using angular decoupling of an input signal beam 44 and an amplified output signal beam 22, with simultaneous spatially inhomogeneous optical pumping of two gain medium elements 24, 26. For some applications, only one amplifying stage with only one gain medium element 24, 26 is sufficient.

The gain medium element 24, 26 of this invention is a thin amplifying gain medium (e.g., a disk, first described by Giesen, as referenced above), but it is conceivable that gain media of different shape could be used as well. Each gain medium element 24, 26 is mounted onto a thermally conducting element, represented herein with a heat sink 28, 30, to remove excess heat. The back side of each gain medium element 24, 26 is coated with a reflective multilayer dielectric stack 32, 34. Power supply connections and other support hardware typically used with the gain medium elements 24 are well known in the art and are not presented herein.

The basic gain media disk system architecture is known in the prior art, but, in the conventional systems, it is used with uniform optical pumping, which requires limitation of the physical size of the gain medium element 24, 26. In order to have a system using the spatially inhomogeneous optical pumping beams, so as to minimize the potential for parasitic oscillation modes and amplified spontaneous emissions, the present invention incorporates optical phase mask elements 40, 41, which are attached at the exit end of the optical pump source, not shown, to spatially modulate the input pump beams 20, 21. If there is more then one amplifier stage, an image relay system 42 with gain-medium imaging elements should be used for spatial mapping of gain regions 10 of one gain medium element 24 onto the gain regions 10 of the subsequent gain medium element 26.

The embodiments of the present invention encompass on-axis and off-axis oscillation mode cases. In the on-axis oscillation mode cases, the laser resonator beam's propagation is perpendicular to the surface of the gain medium element 24, and the gain medium element 24 forms one of the cavity end mirrors, due to the reflective multilayer dielectric stack 32. The input pump beams 20, 21 strike the gain medium element 24 either an angle relative to the gain medium element 24 surface, when either one or two symmetrically placed optical pumps can be used, or along the normal direction to the gain medium element 24 surface. In the latter case, a dichroic or polarization means can be used to decouple the pump light from the oscillation light inside the cavity.

In the off-axis oscillation mode cases, the laser resonator beam strikes the gain medium element 24 at an angle off the normal angle, e.g. of 45 degrees, and a pair of conventional reflective elements forms the end-mirrors of the cavity. One or both of these end-mirrors can be formed by gain medium elements 24, operating in the on-axis oscillation mode. In this case, the pump light can strike the gain medium element 24 perpendicular to the surface of the gain medium element 24.

Figure 6:
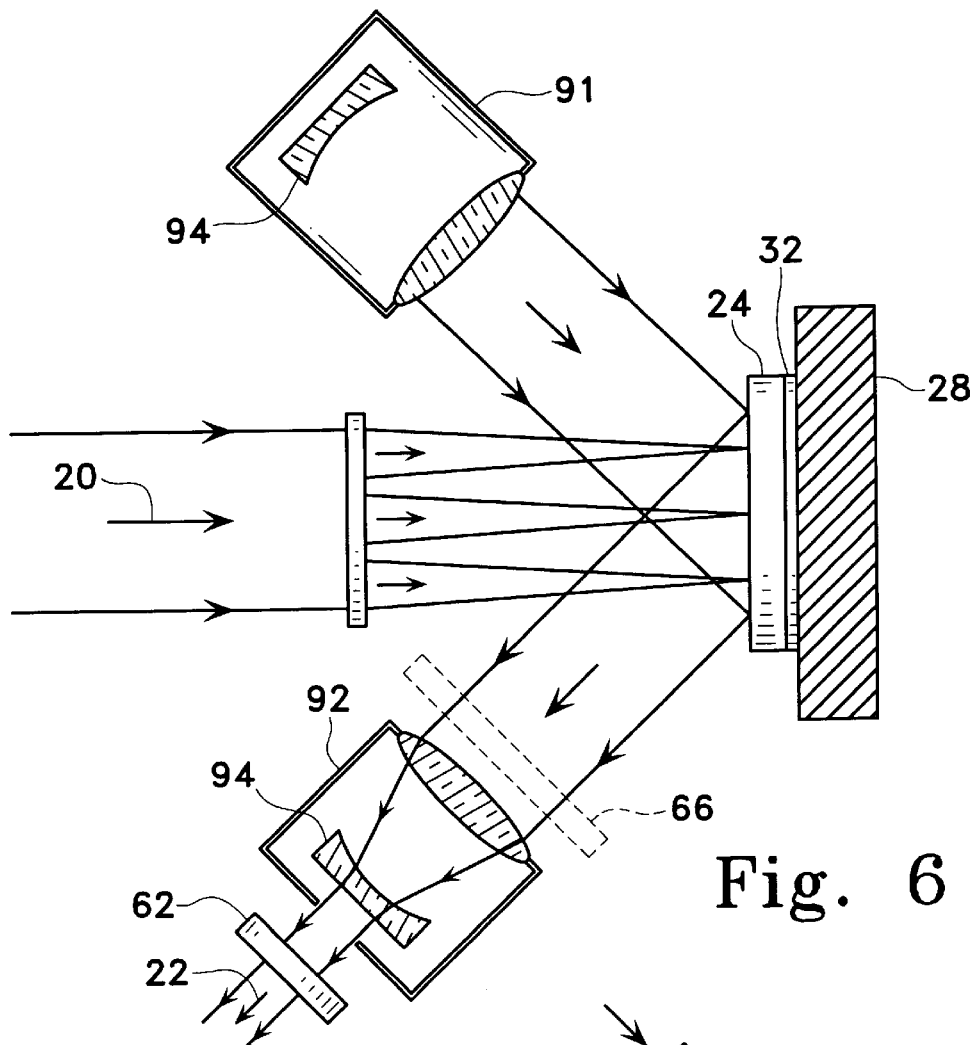
FIG. 6 is an illustration of another embodiment of the present invention, an off-axis single-gain element oscillator with an on-axis pump beam array, with an intracavity image-preserving relay system.
Figure 7:
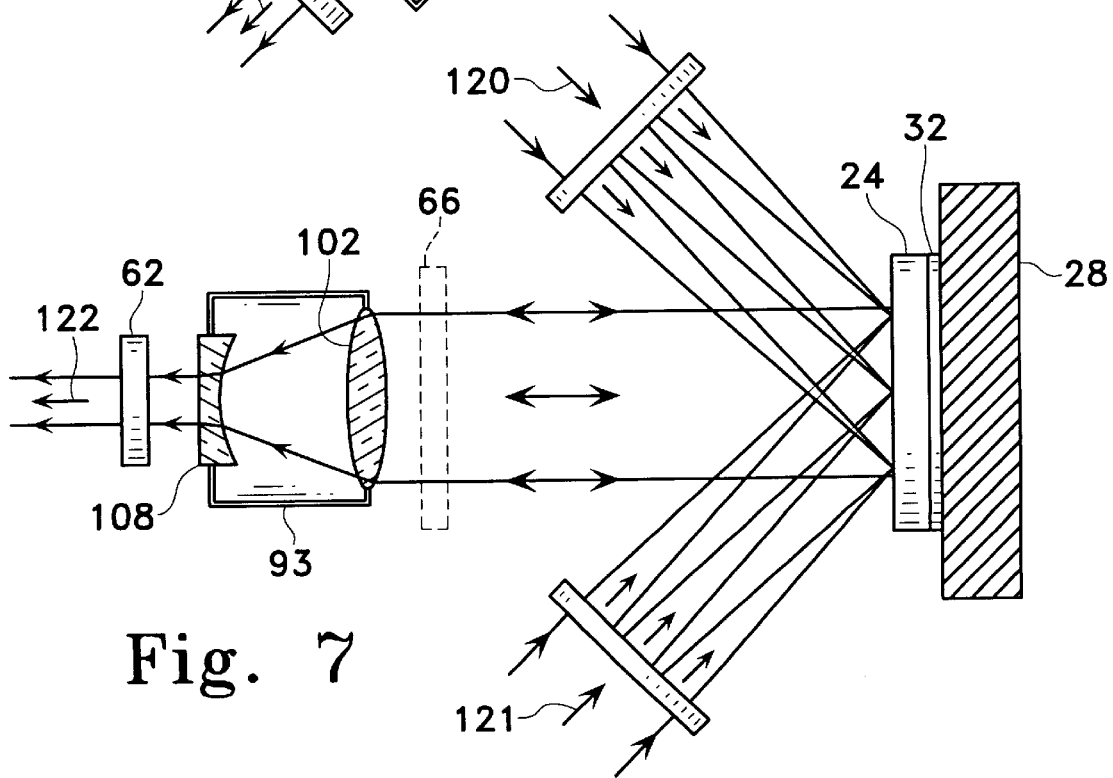
FIG. 7 is an illustration of another embodiment of the present invention, an on-axis oscillation mode system with off-axis pump beam array, using a simple gain element.
Figure 8:
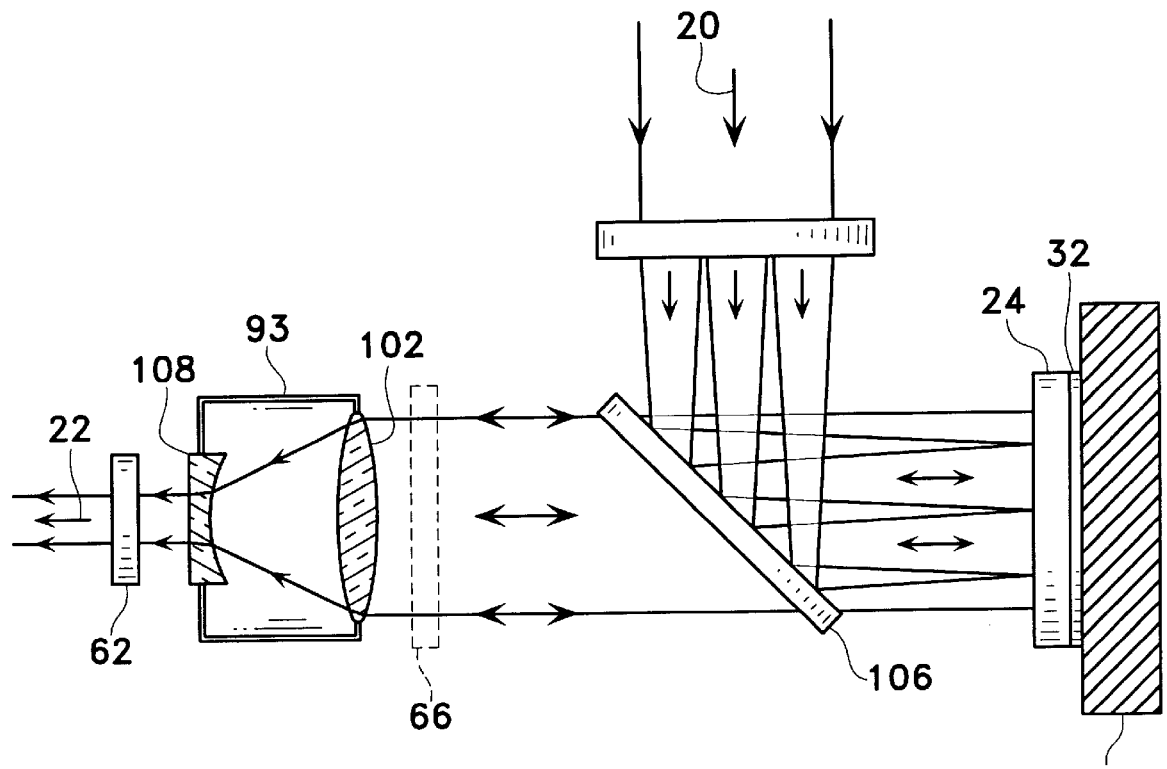
FIG. 8 is an illustration of another embodiment of the present invention, an on-axis oscillation mode system with off-axis pump beam array, using a simple gain element.

FIGS. 6, 7 and 8 show several cases of oscillators using a simple gain medium element 24, having the intracavity image relay system 42. FIG. 6 illustrates a single-gain element oscillator with off-axis oscillation mode and on-axis pump beam array. This embodiment of the present invention uses a folded telecentric system with 100% reflector 91, having a reflector 94 and a lens 102, a folded telecentric system with output coupler 92, and a phase corrector plate 62.

FIG. 7 illustrates a single-gain element oscillator with off-axis pump beam array and on-axis oscillation mode. The system uses a folded telecentric system with output coupler 93, an off-axis pump-beam array sending an input pump beam 120 and an optional second off-axis pump-beam array sending an input pump beam 121, and creating an amplified output signal beam 122.

FIG. 8 illustrates an embodiment using of a dichroic beam splitter 106 which reflects the input pump beam 20 towards the gain medium element 24, and transmits the intracavity oscillation mode photons. The cavity is formed by the gain medium element 24 on one end, having the reflective multilayer dielectric stack 32 which forms the totally reflecting rear mirror of the cavity, and an output coupler 108 on the other end of the cavity.

The design of the optical pump source, is well known in the art and therefore is not shown in the FIGS. 2–5. However, some forms of the optical pump sources are shown in FIGS. 6–9. When the optical pump source is in the form of a laser or lamp, for the present invention to render the input pump beams 20, 21 to be spatially inhomogeneous, it is necessary to add a spatial modulating element such as the optical phase mask element 40, 41, which can be in the form of a lenslet array plate, binary optical plate or a holographic plate, for generating spatially modulated optical pump beam 14, 15. However, the inhomogeneous pumping of the present invention can also be realized using an array of laser diodes (either coherent or incoherent), an optical fiber bundle delivery system, or a multi-mode fiber with a large diameter of the core, in which case the optical phase mask element 40, 41 is not needed. When the multi-mode fiber is used for the optical pump, if more than one amplifier stage is used, a beam splitter is needed in order to produce the identical input pump beams 201, 202 and 203.

Figure 9:
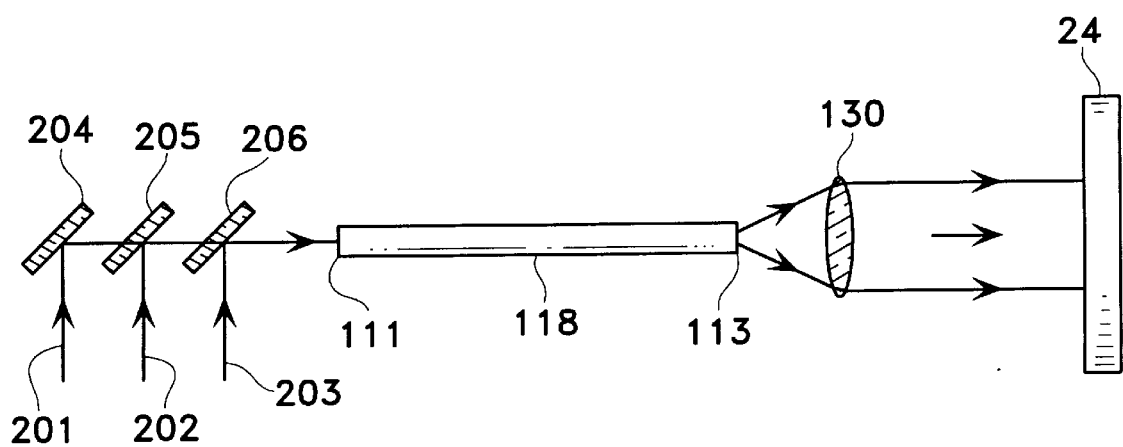
FIG. 9 is an illustration of another embodiment of the present invention, where 14 a long multi-mode fiber is used to combine several pump lasers.

FIG. 9 illustrates another embodiment of the present invention, where a long multi-mode fiber 118 is used to combine several pump lasers. The lasers need not be at the same wavelength. The input pump beams 201, 202 and 203 of the pump lasers are reflected off mirrors 204, 205 and 206, enter an input end 111 of the multi-mode fiber 118 and pass through a lens 130. Because the fiber 118 is multi-mode, the light output from its output end 113 of the multi-mode fiber 118 is highly structured, even if only a single laser is placed at the input end 111 of the fiber 118. This highly structured light results in a random pattern of spots on the gain medium element 24, with a speckle-like pattern, just like the frosted glass pattern. If the fiber is jiggled, the spots will shimmer, thus averaging out the thermal effects.

When an array of laser diodes is used, usually between 100 to 1000 diodes forms a composite input pump beam 20, which is imaged onto the gain medium element 24 through the air, and each diode forms a spot on the plane of the gain medium element 24. If one diode fails, it represents only a small fraction of the total array, of less then one percent, so the system having an array of laser diodes can gracefully degrade. In the alternative, a bundle of fibers can be used to direct the input pump beams 20 from an array of pump lasers to the gain medium element 24.

The present invention relates to the gain medium element 24, 26 in a three-level system, although the approach will also work for a four-level system, including semiconductor-based media. The architecture of the basic pumping system of FIG. 2 provides more compact, energy-scalable and more pump-photon-efficient laser systems. The amplifying gain medium element 24, 26 is typically made of a thin piece of material for efficient heat removal, in order to minimize thermal distortions. However, the laser system of the present invention can also address thermal lensing effects, especially in the case of cascaded or multiple gain medium elements 24, 26. If significant, the deterministic thermal distortions can be compensated by static phase-corrector plates 62, 63, as shown in subsequent FIG. 4. Further, the phase-conjugate schemes, like the one shown in FIG. 5, relax the need to minimize thermal distortions due to their wavefront-reversal compensation capabilities.

The present invention has two preferred embodiments with the basic amplifying architectures. The off-axis system with angular decoupling of the input signal beam 44 and the amplified output signal beam 22 is shown in FIGS. 2 and 6 and described above. The on-axis system with polarization decoupling of the input signal beam 44 and the amplified output signal beam 22, and with dichroic decoupling of the input pump beam 20, 21 and the input signal beam 44, is shown in FIG. 3, and also in FIGS. 7 and 8.

Figure 3:
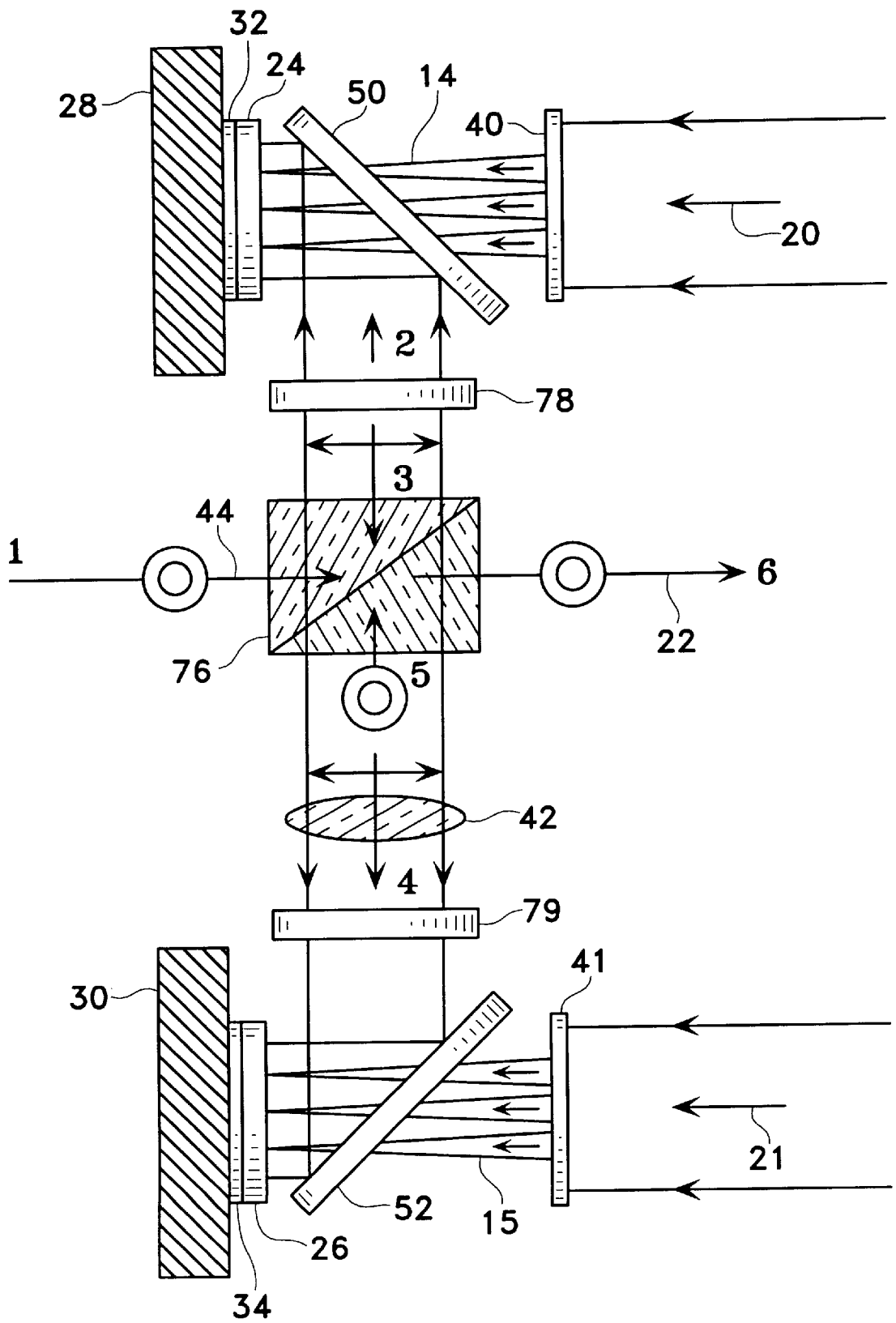
FIG. 3 is an illustration of the basic architecture of a pumping scheme of another embodiment of the present invention, using polarization decoupling of the input and the amplified output signal beams, and a dichroic beam splitter for efficient pumping by the spatially inhomogeneous beam.

In either case presented in FIGS. 2 and 3, the input pump beams 20, 21 first propagate through the optical phase mask elements 40, 41, which can be in the form of a computer-generated holographic plate, a lenslet array plate, or a binary phase plate mask. The optical phase mask elements 40, 41 modulate each uniform input pump beam 20, 21 into the spatially modulated optical pump beam 14, 15 with the same two-dimensional pumping pattern, so that the beam 14, 15 is optically pumped into the gain medium elements 24, 26 in a spatially inhomogeneous manner. The pumping pattern can be in the form of a complex speckle-like pattern, a series of spots, or have some other general pattern of discrete intense features.

Since the imaging systems in the various embodiments of the present invention reproduce the spot patterns on the gain medium element 24 upon each traversal through the system, the details of the spot patterns are not critical. However, the array of optical spots is required to optically segment or fragment the gain medium element 24 into discrete regions 10 and 12. When necessary, the phase-corrector plates 62, 63 are used to compensate for distortions. The spots on the gain medium element 24 can be created to be symmetric or in a random pattern.

Symmetric two-dimensional array of focused spots on the plane of the gain medium element 24 can be created by a lenslet array, grating arrays, an array of diffractive or holographic lenses, or by using binary optical elements or Fresnel Zone plate arrays, to realize an equivalent array of lenses for the optical pump. An array of laser diodes can be imaged onto the surface of the gain medium element 24 with a set of lenses or through a bundle of optical fibers. The array of diffractive or holographic lenses can be computer generated, or can be holographically exposed using photo-lithographic techniques. Random phase mask plates can be made by random etching of quartz or glass material, which forms a frosted glass pattern, or by using multi-mode fibers. When the optical pump beam strikes such a phase mask plate, a random pattern of speckle-like spots is formed at the gain medium element 24. All types of spot patterns can be dynamically moved during operation, to smooth out thermal variations across the gain medium element 24.

FIG. 3 is an illustration of another embodiment of the present invention, showing the basic architecture of a pumping scheme for efficient pumping of the spatially inhomogeneous beam, using polarization decoupling of the input signal beam 44 and the amplified output signal beam 22, in a polarizing beam splitter 76, two quarter-wave plates 78, 79, and dichroic beam splitters 50, 52. The dichroic beam splitter 50, 52 enables efficient pumping of the spatially inhomogeneous beam, by reflecting the input signal beam 44 and transmitting the input pump beam 20, 21.

The polarizing beam splitter 76 directs the input signal beam 44 towards the gain medium element 24 and reflects the amplified output signal beam 22 out of the laser system. It also separates the input signal beam 44 from the amplified output signal beam 22 and optically isolates the amplified output signal beam 22 to prevent it from reentering at the input. The quarter-wave plate 78, 79 is a polarization rotation element disposed between the dichroic beam splitter 50, 52 and the gain medium element 24, 26. It rotates the polarization of the returning amplified radiation by ninety degrees with respect to the unamplified input radiation. This causes the amplified radiation to be directed out of the laser, and not be reflected or passed into the master oscillator by the polarizing beam splitter 76.

In the case of multiple gain medium elements 24, 26, the same generation mask pattern should be used for all optical pump sources, for the sake of simplicity and for proper spatial mapping of the effective gain pattern profile of the amplified output signal beam 22 onto the subsequent gain medium element 26, via the optical image relay system 42. Without this mapping, light from the gain region 10 of one amplifier gain medium element 24 may illuminate the loss region 12 on the second amplifier gain medium element 26. In the present invention, since the scale size of the transverse features need not be very small, only small enough to avoid parasitics and ASE losses, the resolution of the image relay system 42 need only be reliable enough to minimize possibility of coupling of amplifying gain regions 10 from one amplifier disk gain medium element 24 to the loss regions 12 on subsequent amplifier disk gain medium element 26. Residual optical pump light can be imaged onto subsequent gain medium elements 24, 26 in the cascade, via reflection off the back-side reflective multilayer dielectric stack 32, 34 of the gain medium elements 24, 26, which also reflects the input signal beam 44.

In the preferred embodiments of the present invention, presented in FIGS. 2 and 3, the gain medium elements 24, 26 have high gain regions 10, along with the loss regions 12. The loss regions 12 are created by photons that propagate in a direction transverse to the desired main cavity mode. The gain regions 10 are created by photons that propagate in a direction along the longitudinal path of the desired main cavity mode, unless it is spatially modulated transversely by the input pump beam 20, 21. The optical gain at any particular point within an amplifier is proportional to the input optical intensity of the light beam at that point. High intensity areas of the beam have higher reflectivity and low intensity areas have weak reflection and will be attenuated and even lost from the output beam entirely. Therefore, the intense pump-beam features will result in localized high gain regions 10, as shown in FIG. 1, on the gain medium elements 24, 26, while the dark regions will, in the case of three-level gain media or certain four-level systems such as semiconductors, result in regions of lateral optical loss regions 12.

Figure 4:
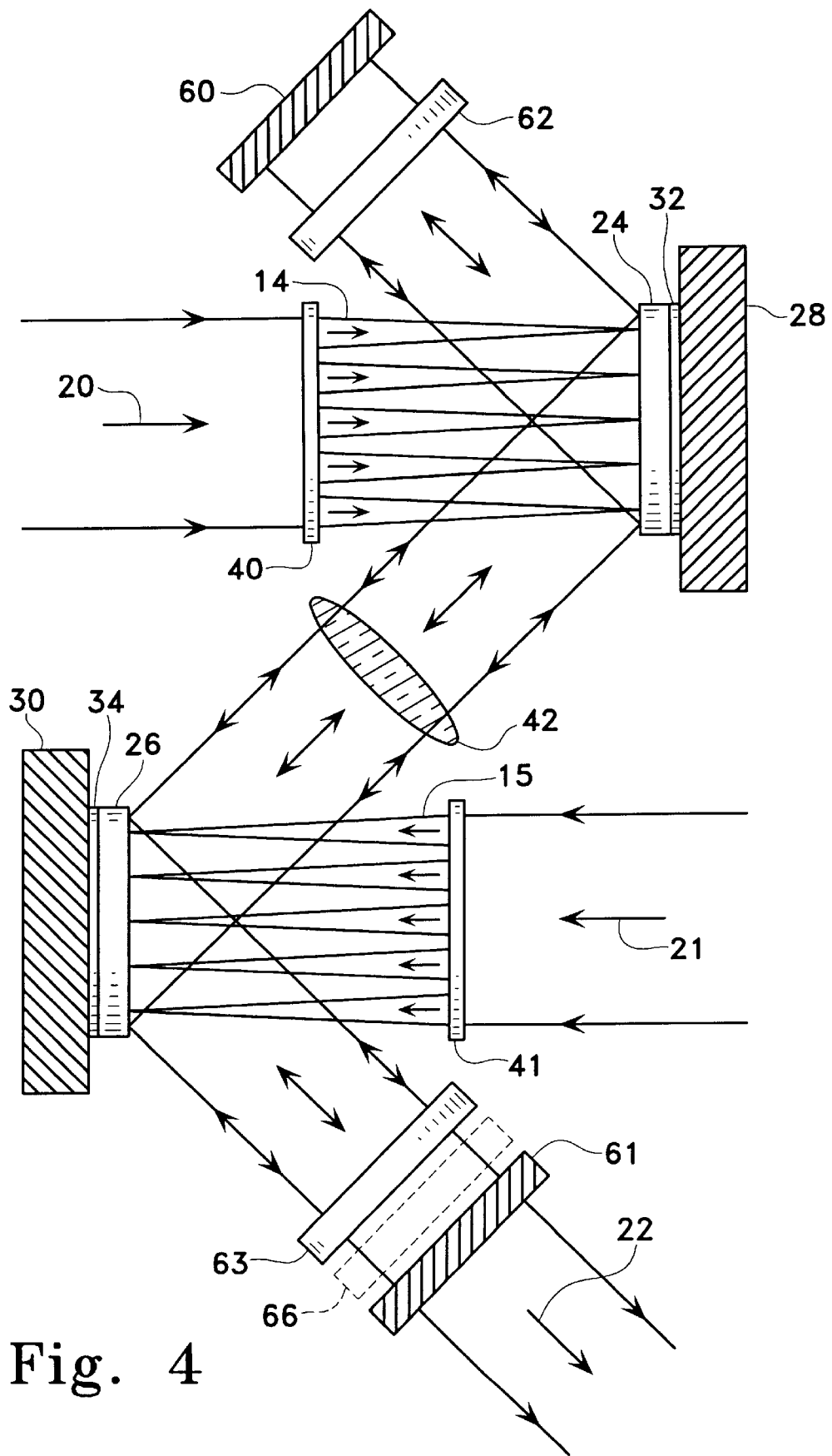
FIG. 4 is an illustration of a laser oscillator of another embodiment of the present invention, using an image relay system between the gain modules for the efficient spatial mapping of the intracavity mode, and cavity mirrors with phase-corrector plates.
Figure 5:
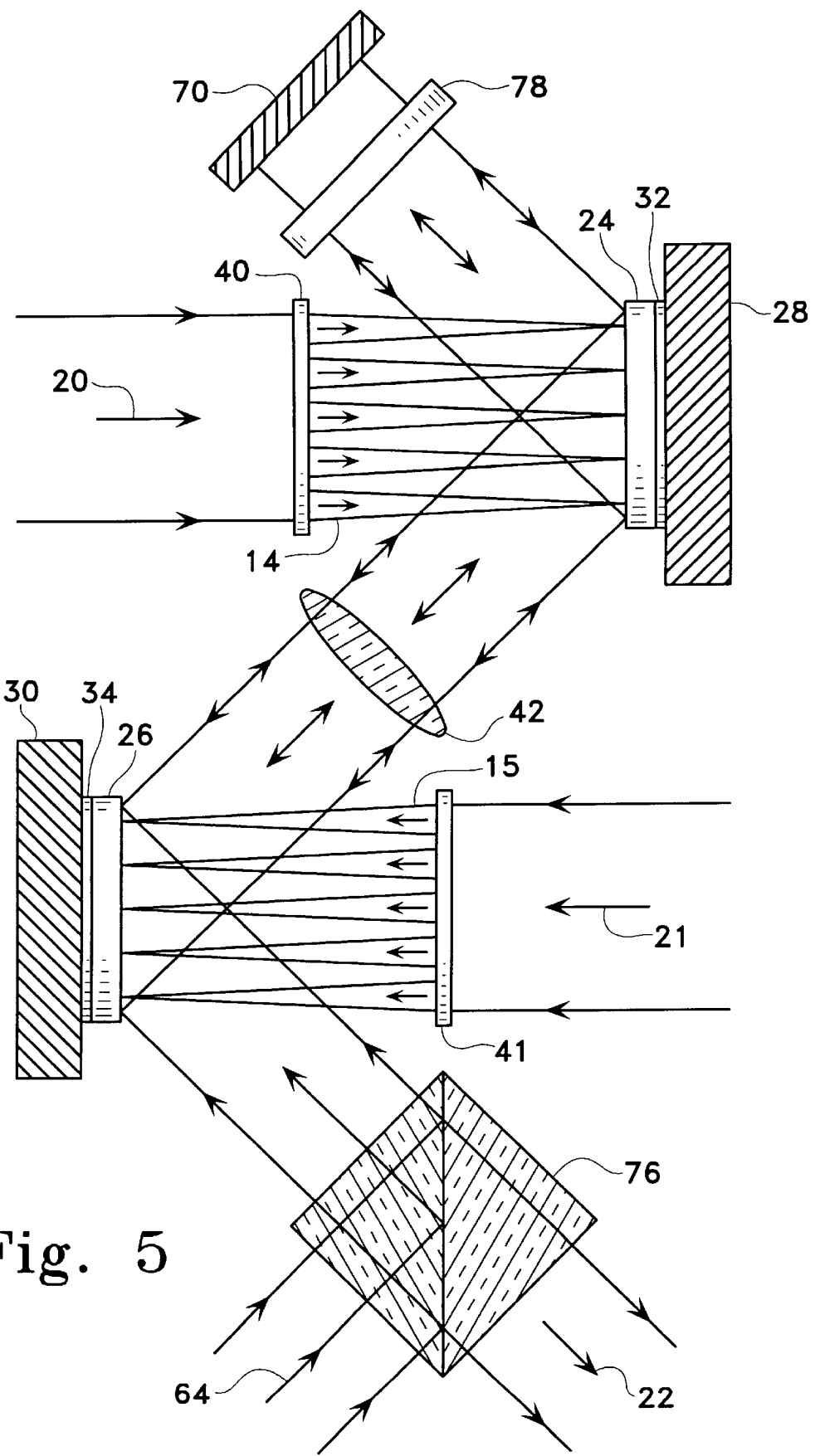
FIG. 5 is an illustration of a phase-conjugate MOPA of another embodiment of the present invention, using polarization decoupling to separate the input master oscillator seed beam from the amplified output signal beam, and a phase-conjugate mirror and a quarter-wave plate.

A cascaded chain of amplifier gain medium elements 24, 26 can be configured as an oscillator, as shown in FIG. 4, or as a double-pass MOPA, as shown in FIG. 5. FIG. 4 is an illustration of a laser oscillator of another embodiment of the present invention, using the proper imaging optical elements for the desired spatial mode. For the system to be configured as an oscillator, the image relay system 42 is used between the gain medium elements 24, 26 for the efficient intracavity optical spatial mapping of the effective gain pattern onto a subsequent gain medium element 26. In addition, the system uses cavity mirrors 60, 61, an optional intracavity optical Q-switch 66 in conjunction with cavity mirror 61, and phase-corrector plates 62, 63 used to compensate for beam distortions and to provide for cavity stability and mode quality. The cavity mirrors 60, 61 are used to enable the complex spatial pattern (e.g., the lenslet spot pattern) of internal spatial features to result in a stable cavity mode.

The Q-switch 66 can also be incorporated as part of the gain medium element 24, 26, in the form of a quantum well structure grown monolithically either on the outer, frontal, surface of the gain medium element 24, 26 or on the back side, sandwiched between the rear surface of the gain medium element 24, 26 and the high-reflectivity back coating reflective multilayer dielectric stack 34.

For laser oscillator embodiment of the present invention, the input pump beams 20, 21 can be either pulsed beams, produced by lasers with gain switching, or continuous waves, produced with cw lasers. In lasers with continuous wave mode which use cavity mirrors 60, 61 as the optical resonators, the optional intracavity optical Q-switch 66 is used to produce a burst of high-peak short power pulses of very high laser energy.

FIG. 5 is an illustration of a double-pass phase-conjugate MOPA of another embodiment of the present invention, using polarization decoupling in a polarizing beam splitter 76 to separate a master oscillator seed beam 64, used herein instead of the input signal beam 44, from the amplified output signal beam 22. A phase-conjugate mirror 70 is disposed beyond the gain element 24 and distally from a master oscillator, not shown. It is used for further amplification of the amplified signals and provides a coherent coupling of the separate gain medium elements 24, 26.

Once conjugation takes place in the phase-conjugate mirror 70, the amplified signal is reflected back to the same gain medium element 24, 26 for amplification in the second pass. The phase-conjugate mirror 70 is used so that the amplified signal will traverse substantially the same path in returning through the gain medium element 24, 26 as it did initially, so that any aberration in the subsequent amplified signals will be subtracted to undo the distortions in the reflected beam, thus removing individual characteristics of the gain medium elements 24, 26 from the amplified output signal beam 22, for dynamically adjusting for changes in the gain medium elements 24, 26.

The polarizing beam splitter 76 had polarized the master oscillator seed beam 64 at its entrance, and a polarization rotation element is needed to modify the polarization of the amplified output signal beam 22, so that the reflected beam can exit through the polarizing beam splitter 76 as the amplified output beam signal 22. The polarization rotation element in this embodiment of the present invention is a quarter-wave plate 78, disposed between the phase-conjugate mirror 70 and the gain medium element 24, in order to improve the quality of reflected light beam. By using the phase-conjugate mirror 70, the desired spatial mode of the MOPA can be realized with more efficient optical design rules.

In the MOPA configuration of the present invention, a master oscillator, not shown, is required for providing the seed beam 64. The seed beam 64 is injected into an amplifying stage where it is amplifies to provide desired higher power output laser radiation. The master oscillator includes a low energy, high quality laser oscillator, and the laser oscillator presented in FIG. 4 could be used to provide desired laser radiation for the master oscillator. In the present invention, in order to coherently combine the spatially inhomogeneous array of gain regions 10, the phase-conjugate mirror 70 can be used in a double-pass geometry. In the case of a single-pass MOPA architecture, the phase-conjugate mirror 70 could be a two-wave mixing element or a double-pumped phase-conjugate mirror. In addition, other conventional polarization elements can be used to outcouple the amplified output signal beam 22, either after two passes or after four passes, similarly to the method used in the laser diode amplifier array phase-conjugate MOPA systems.

Further, a wavefront beam clean-up element, not shown, such as a two-wave mixer or a double-pumped phase-conjugate mirror (DPCM) can be used to coherently combine the output of either the single-pass MOPA system, presented in FIG. 5, or an aberrated output of the oscillator system, presented in FIG. 4.

The optical pumping source pattern can be dynamically changed by rotating, jiggling or shaking the optical phase mask element 40, 41, or lenslet array, or by dynamic bending of a multi-mode optical fiber pump-beam delivery system, to spatially homogenize the thermal loading of the gain medium elements 24, 26 during the laser system's thermalization time constant, so that the gain regions 10 will be evenly distributed on the gain medium elements 24, 26 to prevent excessive heating in localized areas.

An optical re-imaging system can be used to take the image of the spot pattern on the gain medium element 24 surface, and re-map the same spot pattern back in perfect registration, after reflection from the other end of the cavity. An example of such an imaging system is the folded telecentric system 91, presented in FIG. 6. The optical re-imaging system has a unity magnification flat-field image, and a non-inverted flat-field image. For the stable optical cavity, the new image is reflected back onto itself and oscillates. This can be realized with a lens, followed by a curved mirror. The re-imaging system always replicates the spot patterns, even if they are moving in time, due to the fact that the time it takes the light to strike the mirror and return to the surface of the gain medium element 24 is much shorter than the time it takes the spot pattern to be changed, in the ratio of several nanoseconds versus several milliseconds. The same time scales also apply to how long it takes the gain medium element 24 to readjust to the changing optical pattern. Therefore, the system will always be stable, even under the dynamically moving pattern. The optical cavity, intracavity or external cavity with a corrective phase plate, must be used if a diffraction-limited laser output performance is desired, i.e., if the light must be focused to its theoretically smallest feature size.

In many applications the diffraction-limited output is not needed, in which case the dynamic correction techniques are not required. If it is not critical to achieve diffraction-limited output from the system, as is the case for certain material processing applications, the passive optical re-imaging aspect of the basic system will assume that the oscillation mode will be stable and laser oscillation will continue in the face of dynamic pump-beam motion. If diffraction-limited performance is required, a phase-conjugate device, represented in FIG. 5 with the phase-conjugate mirror 70, is required to track this changing spatial profile of the spatially modulated optical pump beam 14, 15. The undesirable amplified spontaneous emission can be suppressed, subject to the energy storage time scale being shorter than the physical motion of the pattern in the transverse direction. However, the dynamic change requires precise adjustment at very high speeds, which makes a laser system more complex, costly and prone to the alignment error. Similar results could be accomplished by spinning the gain medium elements 24, 26, but this method is very difficult to implement because these elements are mounted onto the heat sink 28, 30 and other elements.

The present invention can lead to a new class of low-power, compact, high-efficiency oscillators and MOPA's, as well as to a new class of high-power, cw or Q-switched scalable laser systems. It can be implemented in laser systems for the commercial manufacturing applications (e.g., laser welders), as well as for various DoD applications. Examples of optically pumped gain media that can benefit from this invention include rare-earth-doped materials, in the form of disks, and semiconductor-wafer-based gain media, such as optically pumped mid-IR MQW (e.g., SPSLS) materials.

Instead of a separate Q-switching element, a semiconductor multiple quantum well (MQW) structure can be monolithically grown, either on the front surface of the gain medium element 24, or on the back side of the gain medium element 24, between the gain element and the reflective multilayer dielectric stack 32. These MQW structures are only microns in thickness and can be made part of the gain medium element 24 structure, which would result in a more compact, stable, and easily alignable system.

Some examples of the stable optical oscillators have been shown. Other classes of cavity configurations can also be realized, including unstable resonators, using the same optical fragmentation approaches described above. By implementing the passive optical elements to effectively segment the pump beam, the system cost and complexity are greatly reduced. Further, since the gain material, as well as the reflective element and optimal quantum well Q-switch, is monolithically formed on a single substrate, the output can essentially preserve the wavefront of an input beam, as opposed to conventional methods where a discrete number of physical elements needs to be cut to within a fraction of an optical wavelength, to preserve the optical quality of a signal beam. Subject to dynamic thermal distortions, the system of the present invention may not even require adaptive optical compensation, other than intracavity or external static phasecorrector plates 62, 63.

Finally, fragmented gain regions can be realized electrically, by attaching an electrode array in a pattern similar to the optical pump-beam patterns discussed above. In this case, segmented gain regions can be implemented as before, but driven electrically instead of optically.

By moving (e.g. rotating) the disk or the pump laser pattern, e.g. the optical phase mask element 40, at a rate slower than the stimulated emission rate of the inverted gain medium element 24, yet at a rate comparable to the set time constant, more uniform thermal loading of the gain medium element 24 will result, therefore minimizing thermal distortions in the gain medium element 24, without adversely affecting the laser efficiency.

By using the techniques of the present invention, the area of the disk can be increased considerably, enabling employment of larger volume gain media, thus leading to greater stored energy in the amplifier stage. Moreover, higher gains can be achieved in more compact configurations, since the parasitic-limiting pump threshold can be greatly increased.

While this invention has been described with reference to its presently preferred embodiment(s), its scope is only limited insofar as defined by the following set of claims and all equivalents thereof.

What is claimed is:

1. A method of using a spatially inhomogeneous optical pump beam to pump at least one gain medium in at least one amplifier stage of a laser amplifier or a laser oscillator such that a potential for parasitic oscillation modes and amplified spontaneous emission is minimized, comprising the following steps:

(a) generating at least one spatially modulated optical pump beam;

(b) simultaneously pumping the at least one gain medium element with said at least one spatially modulated optical pump beam to optically fragment the at least one gain medium element into discontinuous amplifying gain regions such that a condition of distributed feedback is substantially obviated in the at least one gain medium element;

thereby creating a mode of operation in the amplifier or oscillator that is substantially outside of the at least one gain medium element.

2. The method as claimed in claim 1, wherein a plurality of the gain medium elements are included in a respective plurality of amplifier stages, further comprising the steps:

pumping each of the gain medium elements with a substantially identical spatially modulated optical pump beam; and spatially mapping the gain regions of the at least one gain medium element onto the respective gain regions of the gain medium element in a subsequent said amplifier stage.

3. The method of claim 1, wherein the mode of operation is substantially perpendicular to a plane of the at least one gain medium element.

4. The method of claim 1, wherein the lossy configuration is sufficient to minimize modes of operation that are substantially parallel to a plane of the at least one gain medium.

5. A laser system using a spatially inhomogeneous optical pump beam to minimize the potential for parasitic oscillation modes and amplified spontaneous emission, comprising:

an input signal beam;

an amplified output signal beam;

at least one spatially modulated optical pump beam;

at least one laser pumping means for generating the at least one spatially modulated optical pump beam; and at least one gain medium element having a plane and a normal to the plane, the at least one gain medium being adapted to receive said input signal beam and be continuously pumped by the at least one laser pumping means with said at least one spatially modulated optical pump beam in order to amplify the input signal beam to produce the amplified output signal beam;

wherein the at least one gain medium element is optically fragmented into discontinuous amplifying gain regions by the at least one spatially modulated optical pump beam;

thereby creating in the at least one gain medium element a lossy configuration to minimize modes of operation that are substantially within the at least one gain medium, while maintaining a high-gain path for a mode of operation that is substantially on-axis to the normal of the plane.

6. The laser system as claimed in claim 5, wherein a plurality of the gain medium elements are included in a respective plurality of amplifier stages, further comprising at least one second gain medium element in a subsequent said amplifier stage, and at least one of a spatial mapping means for spatially mapping the gain regions of the at least one gain medium element onto the respective gain regions of the second gain medium element in a subsequent said amplifier stage, wherein each of the gain medium elements is pumped with a substantially identical spatially modulated optical pump beam.

7. The laser system of claim 5, wherein the laser system is a laser oscillator, further comprising:

at least one cavity mirror in optical communication with at least one of the gain medium elements; and at least one phase-corrector plate in optical communication with the cavity mirror, the phase-corrector plate being used to compensate for beam distortions in the laser system.

8. The laser system as claimed in claim 7 further comprising an intracavity optical Q-switch or a quantum well structure grown on the gain medium element.

9. The laser system as claimed in claim 5 wherein each of the at least one laser pumping means comprising:

an optical pumping source;

an input pump beam generated by the optical pumping source; and an input beam pattern generating means for generating the at least one spatially modulated optical pump beam.

10. The laser system as claimed in claim 9 wherein each said input beam pattern generating means comprises an optical phase mask element to spatially modulate the input pump beam and generate the at least one spatially modulated optical pump beam, wherein said optical phase mask element can be dynamically changed to smooth out thermal variations across the gain medium element.

11. The laser system as claimed in claim 10 wherein the optical phase mask element comprises a multi-mode fiber, or an array of laser diodes, or an optical fiber bundle, to generate the at least one spatially modulated optical pump beam.

12. The laser system as claimed in claim 10 wherein the optical phase mask element is an array of holographic lenses, a lenslet array plate, a binary phase plate mask, a grating array, a group of binary optical elements or a Fresnel Zone plate array.

13. The laser system as claimed in claim 10 wherein the optical phase mask element has a random pattern produced by etching or comprises multi-mode fibers.

14. The laser system as claimed in claim 5 further comprising a decoupling means for decoupling the input signal beam and the amplified output signal beam.

15. The laser system as claimed in claim 14 wherein the decoupling means is an angular decoupling means.

16. The laser system as claimed in claim 14 wherein the decoupling means is a polarization decoupling means.

17. The laser system as claimed in claim 16, wherein the polarization decoupling means comprises a polarizing beam splitter.

18. The laser system as claimed in claim 17, further comprising:

at least one dichroic beam splitter; and at least one polarization rotation means, disposed between the at least one dichroic beam splitter and the at least one gain medium element.

19. The laser system as claimed in claim 17 wherein the laser system is a master-oscillator power amplifier, further comprising:

a master oscillator to provide the input signal beam in the form of a seed beam;

a phase-conjugate mirror, disposed distally from the master oscillator, for reflecting phase conjugate laser radiation in response to amplified laser radiation incident thereon; and a quarter-wave plate, disposed between the phase-conjugate mirror and one of the at least one gain medium element, to modify the polarization state of the amplified laser radiation and to generate the amplified output signal beam to be directed out of the laser system.

20. A method of using a spatially inhomogeneous optical pump beam to pump at least one gain medium in at least one amplifier stage of a laser amplifier or a laser oscillator to minimize the potential for parasitic oscillation modes and amplified spontaneous emission, comprising the following steps:

(a) generating at least one spatially modulated optical pump beam, which comprises the step of passing at least one input pump beam through at least one optical phase mask element, or through a multi-mode fiber, or an array of laser diodes, or an optical fiber bundle, to generate the at least one spatially modulated optical beam pump, wherein the optical phase mask can be dynamically changed to minimize thermal variations across the at least one gain medium element;

(b) simultaneously pumping the at least one gain medium element with said at least one spatially modulated optical pump beam to optically fragment the at least one gain medium element into discontinuous amplifying gain regions;

thereby creating a lossy configuration sufficient to obviate lateral modes of operation, while maintaining a high-gain path for a longitudinal mode of operation.

21. The method of claim 20, wherein the at least one gain medium element has a plane and the lateral modes of operation are substantially parallel to the plane.

22. The method of claim 20, wherein the at least one gain medium element has a plane and the longitudinal mode of operation is substantially normal to the plane.

23. The method of claim 22, wherein the longitudinal mode of operation is on-axis to the normal of the plane.

24. The method of claim 22, wherein the longitudinal mode of operation is off-axis to the normal of the plane.

25. A laser system using a spatially inhomogeneous optical pump beam to minimize the potential for parasitic oscillation modes and amplified spontaneous emission, comprising:

an input signal beam;

an amplified output signal beam;

at least one spatially modulated optical pump beam;

at least one laser pumping means for generating the at least one spatially modulated optical pump beam;

a plurality of amplifier stages comprising a subsequent amplifier stage, each of the amplifier stages comprising a plurality of gain medium elements, the subsequent amplifier stage comprising at least one second gain medium element, the plurality of gain medium elements each having a plane and a normal to the plane, and each of the plurality of gain medium elements being adapted to receive the input signal beam and be continuously pumped by the at least one laser pumping means with the at least one spatially modulated optical pump beam in order to amplify the input signal beam to produce the amplified output signal beam;

at least one image relay system for spatially mapping a plurality of gain regions of the at least one gain medium element onto respective gain regions of the second gain medium element in the subsequent amplifier stage, wherein each of the plurality of gain medium elements is pumped with a substantially identical spatially modulated optical pump beam;

wherein the plurality of gain medium elements are optically fragmented into discontinuous amplifying gain regions by the at least one spatially modulated optical pump beam;

thereby creating in the plurality of gain medium elements a lossy configuration to minimize modes of operation that are substantially lateral to the normal of the plane, while maintaining a high-gain path for a mode of operation that is substantially on-axis to the normal of the plane.

26. A method of using a spatially inhomogeneous optical pump beam to pump a gain medium element while minimizing parasitic oscillation modes and amplified spontaneous emission, comprising the following steps:

(a) generating a spatially modulated optical pump beam;

(b) pumping the gain medium element with the spatially modulated optical pump beam;

(c) optically forming in the gain medium element discrete gain regions and loss regions, the combination of discrete gain regions representing a combined transverse area that can provide a combined gain that is greater than a single gain provided by a single gain region having a single transverse area that is substantially equal in size to the combined transverse area;

(d) inputing into the gain medium element an input signal;

whereby an operation oscillation mode is created and characterized as being one of on-axis and off-axis to a normal of the gain medium element and substantially outside of the gain medium element.

27. A laser system using a spatially inhomogeneous optical pump beam to minimize the potential for parasitic oscillation modes and amplified spontaneous emission, comprising:

an input signal beam;

an amplified output signal beam;

a spatially modulated optical pump beam;

a gain medium element for receiving the input signal beam and the spatially modulated optical pump beam, the gain medium comprising a plurality of discrete gain regions and loss regions, the combination of discrete gain regions representing a combined transverse area that can provide a combined gain that is greater than a single gain provided by a single gain region having a single transverse area that is equal in size to the combined transverse area;

whereby an operation oscillation mode of the laser system is characterized as being substantially non-distributed feedback.

* * * * *